United States Patent [19]
Farrow et al.

[11] Patent Number: 5,792,510
[45] Date of Patent: Aug. 11, 1998

[54] METHOD FOR MAKING A CHEMICALLY-ORDERED MAGNETIC METAL ALLOY FILM

[75] Inventors: Robin Frederick Charles Farrow; Ronald Franklin Marks, both of San Jose, Calif.

[73] Assignee: International Business Machines Corporation, Armonk, N.Y.

[21] Appl. No.: 872,112

[22] Filed: Jun. 10, 1997

[51] Int. Cl.$^6$ .......................................... B05D 5/12
[52] U.S. Cl. .................... 427/130; 204/554; 427/131; 427/132; 427/374.3; 427/377; 427/380; 427/383.1; 427/399; 427/404
[58] Field of Search .................... 427/130, 132, 427/131, 377, 380, 383.1, 399, 374.3, 404; 204/554

[56] References Cited

U.S. PATENT DOCUMENTS 5,206,590  4/1993  Dieny et al. ........................ 324/252

OTHER PUBLICATIONS

M. Algueró et al., "In Situ Measurement of the Rate of H Absorption by a Pd Cathode During the Electrolysis of Aqueous Solutions", *Review of Scientific Instruments*, vol. 68, No. 2, Feb. 1997, pp. 1324–1330.

V. F. Degtyareva et al., "Distortions of the F.C.C. Crystal Lattice of $Pd_{60}Cu_{40}$ Alloy Hydrogenated Under High Pressure", *Solid State Physics*, vol. 66(a), 1981, pp. 77–86. (No month avail.).

T. B. Flanagan et al., "A Possible Role for Hydrogen–induced Lattice Migration in Alloy Materials Processing", *Journal of Alloys and Compounds*, vol. 231, 1995, pp. 1–9. (No month avail.).

T. Linn et al., "Improved Exchange Coupling Between Ferromagnetic Ni–Fe and Antiferromagnetic Ni–Mn–based Films", *Applied Physics Letters*, vol. 65, No. 9, Aug. 29, 1994, pp. 1183–1185.

*Primary Examiner*—Bernard Pianalto
*Attorney, Agent, or Firm*—Thomas R. Berthold

[57] ABSTRACT

A method for forming a chemically-ordered ferromagnetic or antiferromagnetic metal alloy film allows the temperature and/or time required for annealing to be reduced. The ferromagnetic or antiferromagnetic metal alloy film is dosed with hydrogen either during or subsequent to deposition of the film on a substrate. The metal alloy film is then heated to desorb the hydrogen atoms from the metal alloy. In one embodiment for dosing the metal alloy film with hydrogen a transition metal of the type that catalyzes the dissociative chemisorption of $H_2$, such as palladium (Pd), is deposited as a film in contact with the metal alloy film. The Pd film is then heated and while at an elevated temperature, it is exposed to $H_2$ gas. The $H_2$ becomes dissociated into hydrogen atoms and the hydrogen atoms become chemically absorbed by the Pd film. During subsequent cooling of the Pd film hydrogen atoms in the Pd film become absorbed into the metal alloy film. When the metal alloy film is annealed the hydrogen atoms become desorbed.

14 Claims, 3 Drawing Sheets

C: Pd 30Å / NiMn 304Å / NiFe 116Å / $SiO_2$
B: NiMn 252Å / NiFe 116Å / 220Å Ta / $Al_2O_3$ / glass
(note: $H_{ex}$ is corrected to 116Å NiFe thickness)
A: NiFe 95Å / NiMn 548Å (50.8% Mn) / $SiO_2$ C: Pd 30Å / NiMn 304Å / NiFe 116Å / SiO$_2$
B: NiMn 252Å / NiFe 116Å / 220Å Ta / Al$_2$O$_3$ / glass
(note: H$_{ex}$ is corrected to 116Å NiFe thickness)
A: NiFe 95Å / NiMn 548Å (50.8% Mn) / SiO$_2$

METHOD FOR MAKING A CHEMICALLY-ORDERED MAGNETIC METAL ALLOY FILM

TECHNICAL FIELD

This invention relates generally to a method for making a chemically-ordered ferromagnetic or antiferromagnetic metal alloy film, and more particularly to a method for making an improved chemically-ordered antiferromagnetic film for use in a spin valve magnetoresistive sensor.

BACKGROUND OF THE INVENTION

Chemically-ordered magnetic metal alloy films are of use in various applications, including magnetic recording systems. A chemically-ordered ferromagnetic metal alloy having a composition such as $Fe_{50}Pt_{50}$ or $Co_{50}Pt_{50}$ is useful as a constituent in magnetic recording media. A chemically-ordered antiferromagnetic metal alloy film is useful in spin valve magnetoresistive (SVMR) sensors or heads for reading magnetically-recorded data.

SVMR sensors are based on the phenomenon of giant magnetoresistance (GMR) that has been observed in a variety of magnetic multilayered structures. The physical origin of GMR is that the application of an external magnetic field causes a variation in the relative orientation of neighboring ferromagnetic layers. This in turn causes a change in the spin-dependent scattering of conduction electrons and thus the electrical resistance of the structure. The resistance of the structure thus changes as the relative alignment of the magnetic moments of the ferromagnetic layers changes. A SVMR sensor is a sandwich structure comprising two uncoupled ferromagnetic layers separated by a nonmagnetic metallic layer in which the magnetization direction of one of the ferromagnetic layers is pinned. The pinning is typically achieved by depositing the ferromagnetic layer onto an antiferromagnetic layer to exchange couple this pair of layers. Only the magnetic moment of the unpinned or free ferromagnetic layer in the SVMR sensor is free to rotate in the presence of an external magnetic field. IBM's U.S. Pat. No. 5,206,590 discloses the basic SVMR sensor for use as a read sensor or head for reading magnetically-recorded data in a magnetic recording disk drive. One particularly useful type of antiferromagnetic material for interfacial exchange coupling with the pinned ferromagnetic layer in SVMR sensors is the chemically-ordered $Ni_{50}Mn_{50}$ metal alloy. Similar pinning by interfacial exchange coupling from chemically-ordered antiferromagnetic metal alloys is also of interest in magnetoelectronic structures, including GMR memory devices and magnetic tunnel junction devices.

The use of hydrogen heat treatment of certain bulk metal alloys under high pressure is known to rearrange the lattice structure of the bulk alloy and in one type of metal alloy to cause a change from one chemically-ordered phase to another chemically-ordered phase, as described by T. B. Flanagan et al., *Journal of Alloys and Compounds* 231 (1995) 1–9.

It is desirable to improve the chemical ordering of ferromagnetic films to improve their magnetic anisotropy and thus the recording characteristics of the magnetic media. It is desirable to improve the chemical ordering of antiferromagnetic films to improve the strength of the interfacial exchange coupling field ($H_{ex}$) of the antiferromagnetic films. In both ferromagnetic and antiferromagnetic chemically-ordered metal alloy films, the chemical ordering is generally achieved by postdeposition annealing of the films. It is thus desirable to reduce the temperature and/or time required for annealing.

SUMMARY OF THE INVENTION

The present invention is a method for forming a chemically-ordered ferromagnetic or antiferromagnetic metal alloy film that allows the temperature and/or time required for annealing to be reduced. The ferromagnetic or antiferromagnetic metal alloy film is dosed with hydrogen either during or subsequent to deposition of the film on a substrate. The metal alloy film is then heated to desorb the hydrogen atoms from the metal alloy. In one embodiment for dosing the metal alloy film with hydrogen a transition metal of the type that catalyzes the dissociative chemisorption of $H_2$, such as palladium (Pd), is deposited as a film in contact with the metal alloy film. The Pd film is then heated and while at an elevated temperature, it is exposed to $H_2$ gas. The $H_2$ becomes dissociated into hydrogen atoms and the hydrogen atoms become chemically absorbed by the Pd film. During subsequent cooling of the Pd film hydrogen atoms in the Pd film become absorbed into the metal alloy film. When the metal alloy film is annealed the hydrogen atoms become desorbed.

For a fuller understanding of the nature and advantages of the present invention, reference should be made to the following detailed description taken together with the accompanying figures.

DETAILED DESCRIPTION OF THE INVENTION

Prior Art

Figure 1:
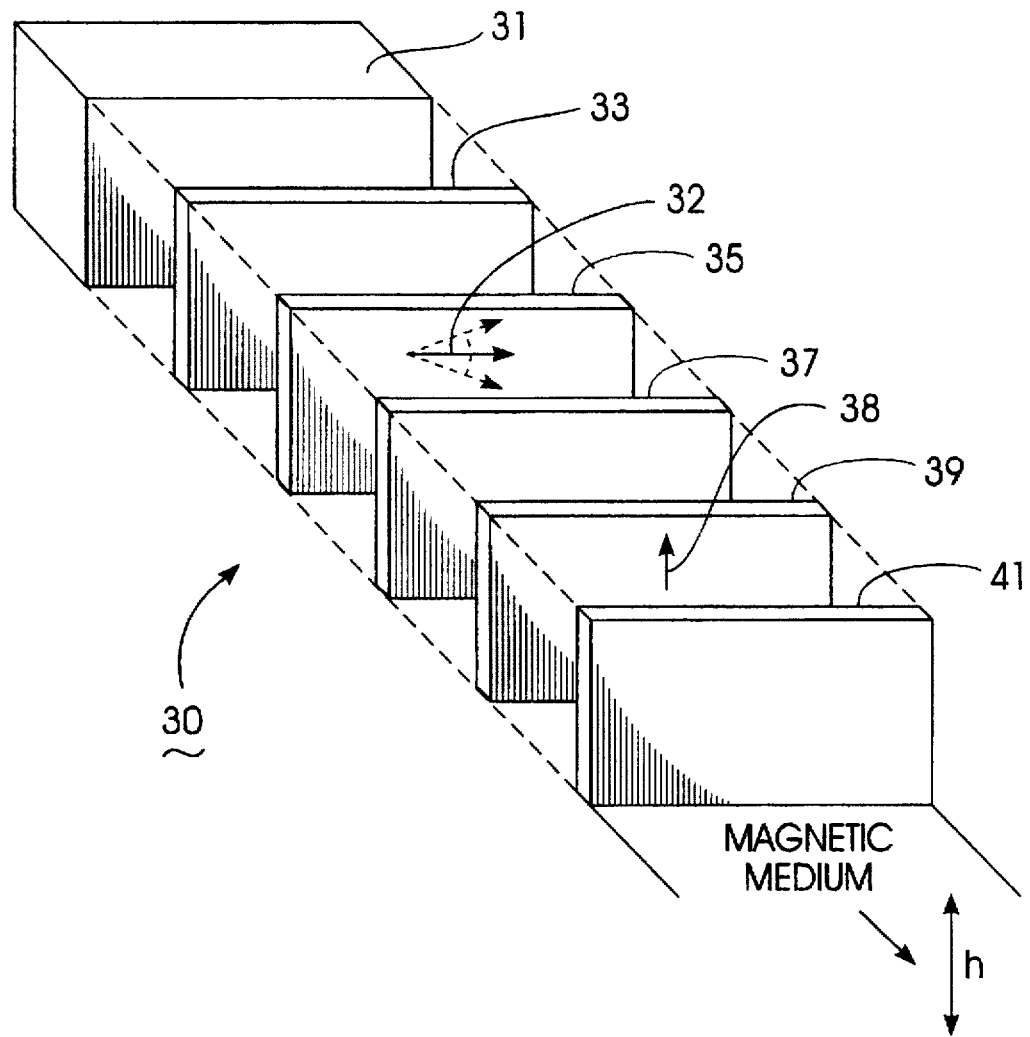
FIG. 1 is an exploded perspective view of a prior art SVMR sensor.

Referring to FIG. 1, a prior art SVMR sensor 30 comprises a suitable substrate 31, such as glass, ceramic, or a semiconductor, for example, upon which is deposited a buffer layer 33, a first thin layer 35 of soft ferromagnetic material, a thin nonferromagnetic metallic spacer layer 37, and a second thin layer 39 of ferromagnetic material. The SVMR sensor 30 may form the read part of a read/write transducer located on the trailing end of an air-bearing slider used in magnetic recording disk drives. The substrate 31 may be the trailing end of the slider. In the absence of an externally-applied magnetic field h from the recorded magnetic medium (depicted in FIG. 1 as the surface on which the bottom edges of the films are supported), the magnetizations of the two layers 35, 39 of ferromagnetic material are oriented at an angle, preferably of about 90 degrees, with respect to each other, as indicated by arrows 32 and 38, respectively. The ferromagnetic layer 35 is called the "free" ferromagnetic layer in that its magnetization is free to rotate its direction in response to an externally-applied magnetic field (such as magnetic field h shown in FIG. 1), as shown by the dashed arrows on layer 35. The ferromagnetic layer 39 is called the "pinned" ferromagnetic layer because its magnetization direction is fixed or pinned in a preferred orientation, as shown by the arrow 38. A thin film layer 41 of an antiferromagnetic exchange biasing material having relatively high electrical resistance is deposited in direct contact with the ferromagnetic layer 39 to provide a biasing field by exchange coupling. Layer 41 thus pins the magnetization of the ferromagnetic layer 39 in a preferred direction so that it cannot rotate its direction in the presence of an applied external magnetic field having a strength in the range of the signal field. The exchange bias layer 41 is typically a suitable antiferromagnetic material, such as chemically-ordered nickel-manganese (Ni—Mn) alloy with a 1:1 atomic ratio. The ferromagnetic layers 35 and 39 are typically formed of permalloy $(Ni_{(80+x)}Fe_{(20-x)}$, where x is greater than or equal to 0 and less than or equal to 5) or other ferromagnetic materials, such as Co, Fe, Ni, and their alloys, such as Ni—Fe, Ni—Co, and Fe—Co. The nonferromagnetic metallic spacer layer 37 is typically Cu.

While the pinned ferromagnetic layer 39 adjacent to spacer layer 37 is typically a single Ni—Fe layer, it is known to form this pinned layer as a two-film structure of a Ni—Fe film and a thin Co film adjacent to the spacer layer 37. similarly, the free ferromagnetic layer 35 may also include a thin Co film adjacent to the spacer layer 37. These Co films increase the magnetoresistance of the sensor but are maintained relatively thin, typically in the range of 2–20 Å, to minimize the effect of the relatively hard magnetic Co material on the switching field of the SVMR sensor.

The SVMR sensor shown in FIG. 1 can also be "inverted", which means that the antiferromagnetic exchange biasing layer 41 is located on the seed layer 33 with the pinned ferromagnetic layer 39 located on and in direct contact with layer 41 and with the free ferromagnetic layer 35 being the top layer in the SVMR sensor. The SVMR sensor will also include a protective capping layer (not shown in FIG. 1), such as Ta, located over the top ferromagnetic layer.

DESCRIPTION OF THE PREFERRED EMBODIMENTS

The invention is a process for forming a chemically-ordered ferromagnetic or antiferromagnetic metal alloy film. The invention will be described in the embodiment for forming a chemically-ordered antiferromagnetic Ni—Mn film for use as the antiferromagnetic layer for pinning the pinned ferromagnetic layer in the SVMR sensor shown in FIG. 1.

Figure 2:
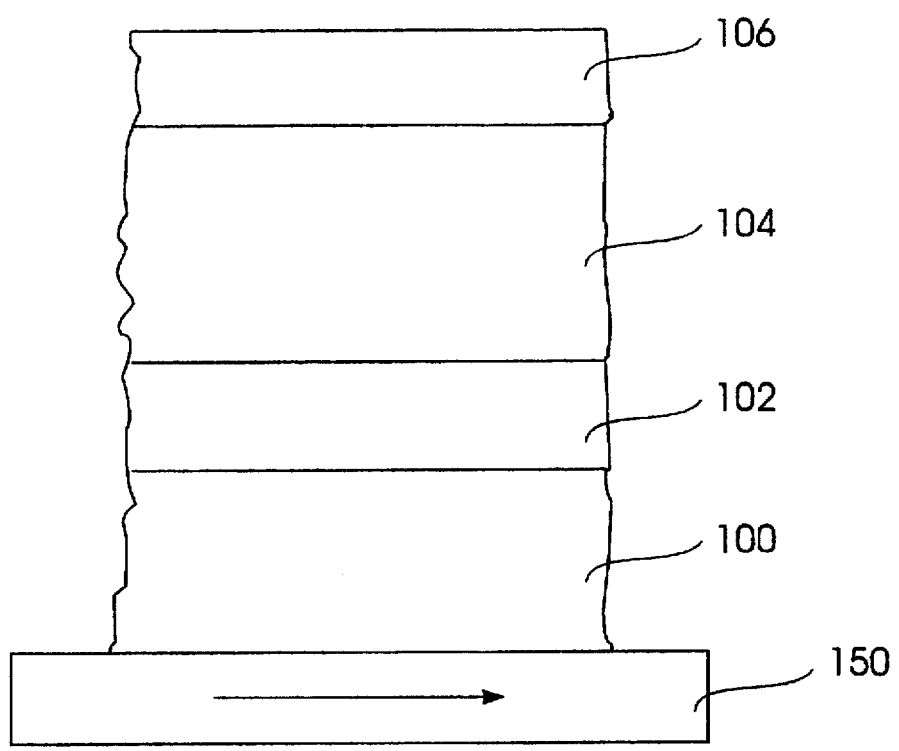
FIG. 2 is a sectional view of the films deposited according to the process of the present invention.

The process will be described with respect to FIG. 2. All of the films are deposited in an ultra-high vacuum molecular beam epitaxy (MBE) system. A suitable substrate 100, which in the experimental example to be described is silicon dioxide (SiO$_2$), is provided as the support for the films. A 100 Å-thick Ni$_{81}$Fe$_{19}$ permalloy film 102 is deposited onto substrate 100 by electron beam evaporation of separate nickel and iron sources. The permalloy film 102 is deposited in the MBE system at room temperature. The permalloy film 102 will become the pinned ferromagnetic layer in the SVMR sensor (layer 39 in FIG. 1). Next, a Ni—Mn film 104 is deposited to a thickness of 300–400 Å directly on the permalloy film 102. The Mn is heated in a crucible while the Ni is heated by the electron beam in the MBE system. The Ni—Mn is deposited in a ratio of nickel to manganese of approximately 1:1, and it is known that the antiferromagnetic property of Ni—Mn requires that chemical ordering occur in its lattice structure. The Ni—Mn film 104 will become the antiferromagnetic layer in the SVMR sensor (layer 41 in FIG. 1). The Ni—Mn film 104 is also deposited at room temperature. Also depicted schematically in FIG. 2 is a magnet 150 which is located beneath the substrate 100 for providing magnetic alignment of the ferromagnetic permalloy film 102 and the antiferromagnetic Ni—Mn film 104.

Next, a transition metal film, such as palladium (Pd) film 106, is deposited in the MBE system to a thickness of 30 Å on top of and in direct contact with the Ni—Mn film 104. The structure of FIG. 2 is then heated to approximately 180° C., and while still warm is transferred to a separate system. In the separate system, the structure is exposed to an atmosphere of 4% H$_2$/96% Ar while the structure is allowed to cool to room temperature for greater than approximately one hour at atmospheric pressure. During this period, the Pd film 106 becomes dosed with H atoms from the H$_2$ gas. Pd has an affinity for hydrogen and acts as a catalyst for the chemisorptive dissociation of H$_2$ gas to H atoms. The H atoms become absorbed into the Pd film 106. Following cooling to room temperature, the Pd film 106 approximately 5–10% H atoms and a corresponding 90–95% Pd atoms. Because the H atoms are mobile in the lattice structure, they are also absorbed into the adjacent Ni—Mn film 104. While in the preferred embodiment the film 106 is formed of Pd, other materials can be used, such as platinum (Pt), niobium (Nb), and tantalum (Ta). If Ta is used, then the hydrogen dosing should occur in the same vacuum system where the Ta film is deposited in order to avoid any surface oxidation.

After the structure has been cooled to room temperature, it is then heated to approximately 200° C. for approximately 2–6 hours. This annealing step desorbs the H atoms from the Ni—Mn antiferromagnetic film 104. If Pd or Pt is used as the transition metal film 106 in contact with the Ni—Mn antiferromagnetic film 104, then the structure can be removed following the exposure to the H$_2$/Ar atmosphere before the annealing step because neither Pd nor Pt forms a substantial surface oxide and thus hydrogen absorption is not impeded. However, if Ta is used, then the annealing should be done in the same system where the structure was exposed to the H$_2$/Ar atmosphere so that annealing occurs without exposure to oxygen.

Figure 3:
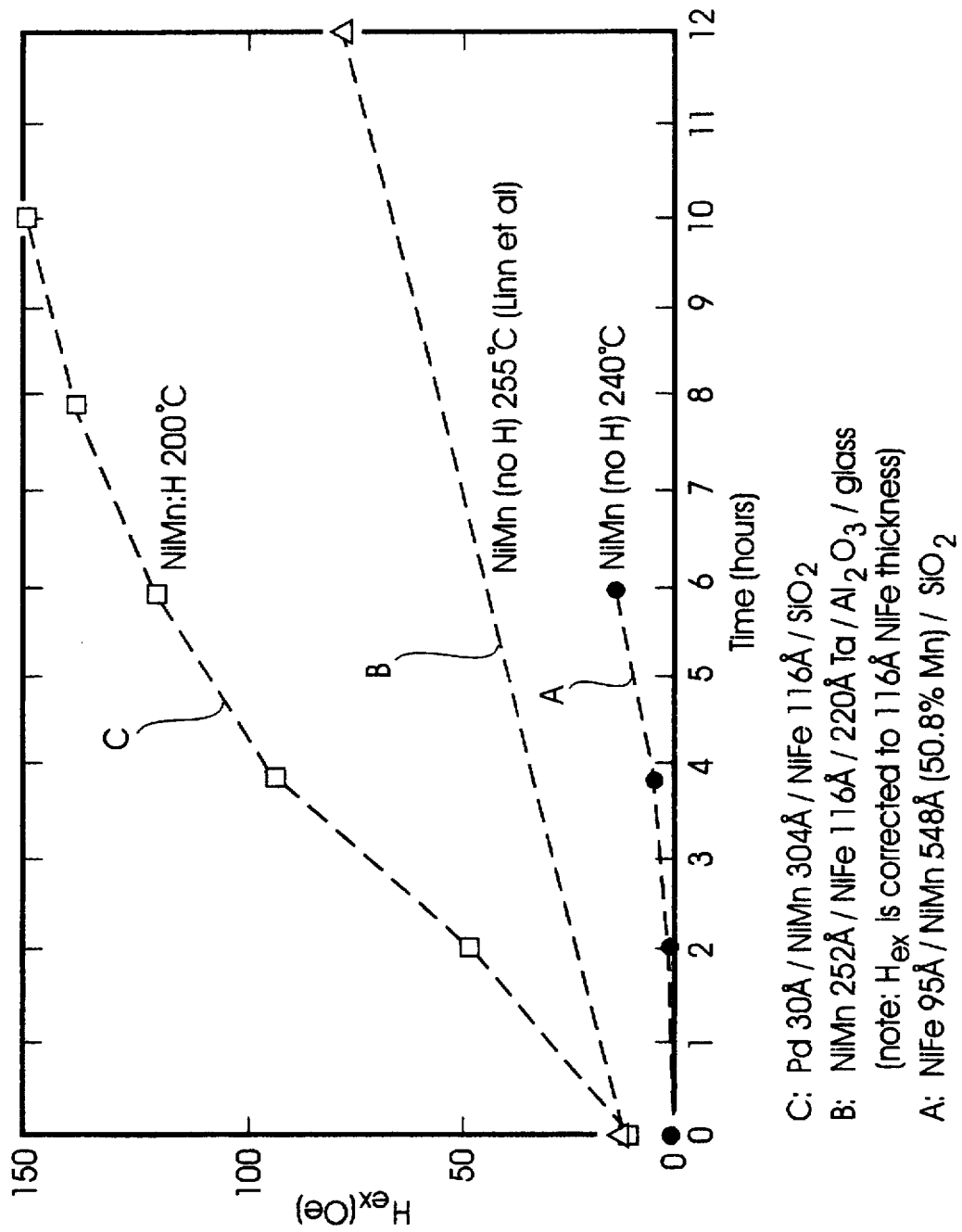
FIG. 3 is a graph of exchange field $H_{ex}$ as a function of anneal time for Ni—Mn antiferromagnetic films processed with and without hydrogen dosing at various anneal temperatures.

Referring now to FIG. 3, the unexpected results of the present process are illustrated by the graph of the exchange bias field H$_{ex}$ (in Oersteads) as a function of annealing time. The lower curve A shows H$_{ex}$ as a function of time for the conventional process with a 95 Å permalloy film where there is no hydrogen dosing of the Ni—Mn film and shows negligible antiferromagnetic behavior, and thus low chemical ordering, even after six hours of annealing at 240° C. Curve B is a graph of data from the published literature for a Ni—Mn film annealed at 255° C. without hydrogen dosing, where the data has been corrected to 116 Å permalloy film thickness to correspond to the same thickness of permalloy as the data of curve C. The data of curve B has been published by T. Linn et al., *Appl. Phys. Lett.*, Vol. 65, 1994, p. 1183. Curve C shows H$_{ex}$ as a function of time with the Pd film hydrogen dosing process according to the present invention with annealing at 200° C. At six hours, H$_{ex}$ is approximately 125 Oe, which is more than sufficient for providing antiferromagnetic exchange biasing in a SVMR sensor.

While the substrate 100 was SiO$_2$ for this experiment, it can be the Cu spacer layer 37 of the SVMR sensor of FIG. 1. In this type of structure, the pinned ferromagnetic layer is the top ferromagnetic layer 41 and the free ferromagnetic layer the bottom ferromagnetic layer 35. In this type of "noninverted" SVMR sensor, as shown in FIG. 1, if the transition metal layer of Pd is replaced with Ta, the Ta can also function as the SVMR sensor capping layer and be located on top of antiferromagnetic layer 41.

The present process can also be performed by first depositing the Pd transition metal layer 106 on substrate 100 followed by the deposition of the Ni—Mn antiferromagnetic layer 104 and then the permalloy ferromagnetic layer 102. In this type of structure, because the Pd is located beneath the pinned ferromagnetic layer and the antiferromagnetic layer, there is no need to remove the Pd film by etching or other known techniques prior to formation of the subsequent films of the SVMR sensor. This type of structure results in the SVMR sensor being of the inverted type. For this inverted structure it may be necessary to load the Pd film with hydrogen prior to deposition of the Ni—Mn film.

The present invention provides the additional advantage, as shown by the data of FIG. 3, that the annealing can occur at a lower temperature. This is especially important during the fabrication of SVMR sensors since high temperature annealing can degrade the magnetoresistance of the sensor.

While the invention has been described with the preferred embodiment of Ni—Mn as the antiferromagnetic film, the present process is applicable to the class of antiferromagnetic films of the type that require chemical ordering to be useful antiferromagnets. These include binary and ternary alloys, such as Pt—Mn, Pd—Mn, Cr—Al and $(PtPd)_{50}Mn_{50}$.

In the preferred embodiment, the hydrogen dosing of the Ni—Mn film is by use of a Pd film exposed to a $H_2$ gas. This causes H atoms to be absorbed into the Ni—Mn film which improves the chemical ordering of the Ni and Mn atoms in the lattice structure. It is also possible to directly implant H atoms into the Ni—Mn film by ion implantation. As another alternative, the Pd film can be electrochemically loaded or charged with H atoms. Electrochemically charging is a technique used to prepare Pd—H alloy films, as described by M. Alguero et al., *Rev. Sci. Inst.*, Vol. 68, No. 2, February 1997, p. 1324. The structure of FIG. 2 is immersed into a room-temperature aqueous solution that contains an ionized salt (e.g., 0.1M LIOH) and electrical contact made to the Pd film 106. Other solutions are 0.1 to 2M $Na_2SO_4$, 0.1 to 2M $H_2SO_4$, 0.1 to 2M NaOH, or any soluble alkali or alkaline earth salt of any nonreducible anion, typically, Li, Na, K, Rb, Cs, $SO_4$, Cl, Br, $ClO_4$, $CO_3$, $HPO_3$, etc. The Pd film 106 forms the cathode. A Pt or Au electrode forms the anode. When a negative potential is applied to the Pd film and current is passed between the electrodes through the solution, H+ ions are collected by the Pd film, which progressively incorporates H atoms. The Pd film readily incorporates H up to a ratio of Pd/H of 2:1 (corresponding to the beta phase $Pd_2H$). Higher concentrations are more difficult to achieve and require either a lower temperature of the solution or an increase in charging potential. Following hydrogen charging, the Pd:H film is capped with Au to prevent oxidation of the Pd:H and loss of hydrogen during air exposure. This can be accomplished by switching the electrolyte to a Au-plating solution and depositing a Au film of about 20 Å. The Au-capped Pd:H film is then removed from the electrochemical cell and transferred to a vacuum chamber where it is annealed at around 200° C. This causes the H atoms to leave the Pd:H film 106 and enter the Ni—Mn film 104, inducing chemical ordering.

While the preferred process has been illustrated and described with respect to a chemically-ordered antiferromagnetic Ni—Mn film for use in a SVMR sensor, the present process can also be used to hydrogen dose chemically-ordered ferromagnetic metal alloy films that are used for magnetic recording media. These types of films have a granular structure consisting of grains of chemically-ordered Fe—Pt or Fe—Pt—X (or Co—Pt or Co—Pt—X) metal alloy in a tetragonal $L1_0$ structure. These types of materials reveal a very high magnetocrystalline anisotropy within the grains. The addition of one or more nonmagnetic materials, designated by X (where X is one or more of Cr, Ag, Cu, Ta, or B) can be substituted into the Fe—Pt or Co—Pt lattice structure or accumulate at the grain boundaries. In these types of films, the chemical ordering and thus the high magnetic anisotropy occurs during subsequent annealing of the films. In the present invention, a transition metal film, such as Pd, is dosed with hydrogen and formed adjacent to the chemically-ordered ferromagnetic film in the manner as described above. The subsequent annealing desorbs the hydrogen from the ferromagnetic film and reduces the time required for annealing to achieve the chemical ordering of the ferromagnetic film.

In the multilayer structures described above, some or all of the films in the structures may be deposited by sputtering, electrochemical deposition or other well-known means.

While the present invention has been particularly shown and described with reference to the preferred embodiments, it will be understood by those skilled in the art that various changes in form and detail may be made without departing from the spirit, scope, and teaching of the invention. Accordingly, the disclosed invention is to be considered merely as illustrative and limited in scope only as specified in the appended claims.

What is claimed is:

1. A method for depositing a ferromagnetic or antiferromagnetic chemically-ordered metal alloy comprising:

forming a metal alloy film on a substrate;

forming directly on and in contact with the metal alloy film a film comprising a transition metal of the type that catalyzes the dissociative chemisorption of $H_2$, the transition metal film consisting essentially of a material selected from the group consisting of Pd, Pt, Nb and Ta;

heating the transition metal film;

while the transition metal film is at an elevated temperature, exposing the transition metal film $H_2$ gas so as to cause $H_2$ to be dissociated into hydrogen atom and the hydrogen atoms to be chemically absorbed by the transition metal film;

cooling the transition metal film for a period of time sufficient to cause hydrogen atom in the transition metal film in contact with the metal alloy film to become absorbed into the metal alloy; and thereafter heating the metal alloy film to desorb the hydrogen atoms from the metal alloy film.

2. The method of claim 1 wherein forming the transition metal film directly on and in contact with the metal alloy film comprises forming the transition metal film on the substrate prior to forming the metal alloy film on the substrate.

3. The method of claim 1 wherein the metal alloy film is an antiferromagnetic film to be exchange coupled with a ferromagnetic film, and further comprising forming the ferromagnetic film directly on the substrate prior to forming the antiferromagnetic metal alloy film.

4. The method of claim 3 wherein the antiferromagnetic film is formed of Ni—Mn.

5. The method of claim 3 wherein the ferromagnetic film to be exchange coupled with the antiferromagnetic film is formed of $Ni_{(80+x)}Fe_{(20-x)}$ where x is greater than or equal to 0 and less than or equal to 5.

6. The method of claim 1 wherein the metal alloy film is a ferromagnetic film formed of material selected from the group consisting of Fe—Pt, Co—Pt, Fe—Pt—X and Co—Pt—X, where X is one or more of Cr, Cu, Ag, Ta and B.

7. A method for depositing a ferromagnetic or antiferromagnetic chemically-ordered metal alloy film comprising:

forming a metal alloy film on a substrate;

forming directly on and in contact with the metal alloy film a film of a transition metal selected from the group consisting of Pd, Pt, Nb and Ta;

electrochemically charging the transition metal film with hydrogen;

heating the hydrogen-containing transition metal film for a period of time sufficient to cause hydrogen atoms from the transition metal film in contact with the metal alloy film to become absorbed into the metal alloy film; and thereafter heating the metal alloy film to desorb the hydrogen atoms from the metal alloy film.

8. The method of claim 7 wherein electrochemically charging the transition metal film comprises:

placing the metal alloy film and transition metal film in an aqueous solution containing an ionized salt;

applying a negative potential to the transition metal film so as to cause hydrogen ions from the solution to be collected by the transition metal film; and capping the hydrogen-containing transition metal film with a capping film to prevent the loss of hydrogen.

9. The method of claim 7 wherein forming the transition metal film directly on and in contact with the metal alloy film comprises forming the transition metal film on the substrate prior to forming the metal alloy film on the substrate.

10. A method for making a spin valve magnetoresistive sensor of the type having a substrate onto which are deposited two ferromagnetic layers separated by a nonmagnetic metal spacer layer, one of the ferromagnetic layers being a pinned ferromagnetic layer whose magnetic moment is fixed in the presence of applied magnetic fields in the range of interest of the sensor, the method comprising:

forming a Ni—Mn alloy film directly on and in contact with a ferromagnetic layer whose magnetic moment is to be pinned, the Ni—Mn film requiring chemical ordering in order to be antiferromagnetic;

forming directly on and in contact with the Ni—Mn film a film of a transition metal selected from the group consisting of Pd, Pt, Nb and Ta;

introducing hydrogen atoms into the transition metal film;

heating the transition metal film to cause the hydrogen atoms from the transition metal film in contact with the Ni—Mn film to become absorbed into the Ni—Mn film to thereby induce chemical ordering in the Ni—Mn film; and thereafter heating the Ni—Mn film to desorb the hydrogen atoms from the Ni—Mn film; whereby the chemically ordered Ni—Mn film becomes antiferromagnetic and pins the magnetic moment of the pinned ferromagnetic layer by interfacial exchange coupling.

11. The method of claim 10 wherein introducing hydrogen atoms into the transition metal film comprises:

heating the transition metal film; and while the transition metal film is at an elevated temperature, exposing the transition metal film to $H_2$ gas so as to cause $H_2$ to be dissociated into hydrogen atoms and the hydrogen atoms to be chemically absorbed by the transition metal film.

12. The method of claim 10 wherein introducing hydrogen atoms into the transition metal film comprises electrochemically charging the transition metal film with hydrogen.

13. The method of claim 12 wherein electrochemically charging the transition metal film comprises:

placing the Ni—Mn film and transition metal film in an aqueous solution containing an ionized salt;

applying a negative potential to the transition metal film so as to cause hydrogen ions from the solution to be collected by the transition metal film; and capping the hydrogen-containing transition metal film with a capping film to prevent the loss of hydrogen.

14. The method of claim 10 wherein the ferromagnetic film whose magnetic moment is to be pinned is formed of $Ni_{(80+x)}Fe_{(20-x)}$, where x is greater than or equal to 0 and less than or equal to 5.

* * * * *